(12) United States Patent
Lebouitz et al.

(10) Patent No.: US 6,887,337 B2
(45) Date of Patent: May 3, 2005

(54) APPARATUS FOR ETCHING SEMICONDUCTOR SAMPLES AND A SOURCE FOR PROVIDING A GAS BY SUBLIMATION THERETO

(75) Inventors: Kyle S. Lebouitz, Pittsburgh, PA (US); Michele Migliuolo, McMurray, PA (US)

(73) Assignee: XACTIX, Inc., Pittsburgh, PA (US)

( * ) Notice: Subject to any disclaimer, the term of this patent is extended or adjusted under 35 U.S.C. 154(b) by 311 days.

(21) Appl. No.: 09/839,763

(22) Filed: Apr. 20, 2001

(65) Prior Publication Data

US 2002/0033229 A1 Mar. 21, 2002

Related U.S. Application Data

(60) Provisional application No. 60/233,512, filed on Sep. 19, 2000.

(51) Int. Cl.$^7$ .......................... H05H 1/00; H01L 21/00; C23F 1/00
(52) U.S. Cl. .............................. 156/345.1; 156/345.33; 156/345.29; 216/73; 216/79
(58) Field of Search ........................ 156/345.1, 345.33, 156/345.29, 345.25, 345.32; 216/73, 79, 58, 59; 438/706

(56) References Cited

U.S. PATENT DOCUMENTS

| 4,190,488 | A | * | 2/1980 | Winters ........................ 216/75 |
| 4,415,402 | A | | 11/1983 | Gelernt et al. |
| 5,200,023 | A | | 4/1993 | Gifford et al. |
| 5,470,390 | A | * | 11/1995 | Nishikawa et al. ......... 118/719 |
| 5,726,480 | A | | 3/1998 | Pister |
| 5,807,761 | A | | 9/1998 | Coronel et al. |
| 5,877,032 | A | | 3/1999 | Guinn et al. |
| 5,877,407 | A | | 3/1999 | Cadet et al. |
| 5,939,886 | A | | 8/1999 | Turner et al. |
| 6,290,864 | B1 | * | 9/2001 | Patel et al. .................... 216/79 |
| 6,328,864 | B1 | * | 12/2001 | Ishizawa et al. ....... 204/298.01 |
| 6,409,876 | B1 | * | 6/2002 | McQuarrie et al. ................ 1/1 |

FOREIGN PATENT DOCUMENTS

| EP | 0 878 824 A2 | 11/1998 | | |
| JP | 02187025 | 7/1990 | | |
| JP | 10-317169 A | * 12/1998 | ............. C23F/1/12 |
| JP | 11145067 | 5/1999 | | |
| JP | 11204509 | 7/1999 | | |
| JP | 11265878 | 9/1999 | | |

OTHER PUBLICATIONS

RD–41537, Research Disclosure, Nov. 1998, pp. 1465–1466.*

(Continued)

*Primary Examiner*—Parviz Hassanzadeh
(74) *Attorney, Agent, or Firm*—Metz Lewis LLC; Barry I. Friedman; Philip E. Levy

(57) ABSTRACT

An etching apparatus for etching semi combustion samples may include one or more variable volume expansion chambers, two or more fixed volume expansion chambers, or combinations thereof in fluid communication with an etching chamber and a source of etching gas, such as xenon difluoride. The apparatus may further include a source of a mixing gas. An etching apparatus may also include a source of etching gas, an etching chamber in fluid communication with the source of etching gas, a flow controller connected between the source of etching gas and the etching chamber, and a vacuum pump in fluid communication with the etching chamber. A source for providing a gas by sublimation from a solid material is also provided, including a vacuum tight container and a mesh mounted in the interior of the vacuum tight container, wherein the mesh is adapted to receive and restrain the solid material.

35 Claims, 13 Drawing Sheets

OTHER PUBLICATIONS

H.F. Winters and J. W. Coburn, "Etching of Silicon with XeF2 Vapor," App. Phy. Lett., vol. 34, No. 1, pp. 70–73, Jan. 1979.

S.J. Sherman, W.K. Tsang, T.A. Core, D.E. Quinn,, "A Low Cost Monolithic Accelerometer," 1992 Symposium on VLSI Circuits, Digest of Technical Papers, Seattle, WA, USA, pp. 34–35, Jun. 4–6, 1992.

P.B. Chu, J.T. Chen, R. Yeh, G. Lin, J.C.P. Huang, B.A. Warneke, and K.S.J. Pister, "Controlled Pulse–Etching with Xenon Difluoride," Transducers 1997, Chicago, IL, pp. 16–19, Jun. 1997.

English language abstract of Japanese publication number 02187025, Patent Abstracts of Japan, Jul. 23, 1990.

English language abstract of Japanese publication number 11145067, Patent Abstracts of Japan, May 28, 1990.

English language abstract of Japanese publication number 11204509, Patent Abtsracts of Japan, Jul. 30, 1999.

English language abstract of Japanese publication number 11265878, Patent Abstracts of Japan, Sep. 28, 1999.

English language abstract of Japanese publication number 10209088, Patent Abstracts of Japan, Aug. 7, 1998.

* cited by examiner

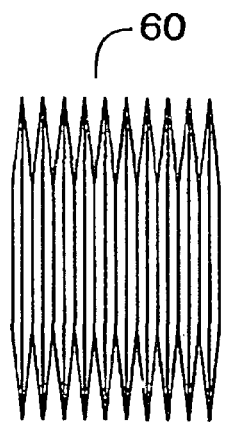
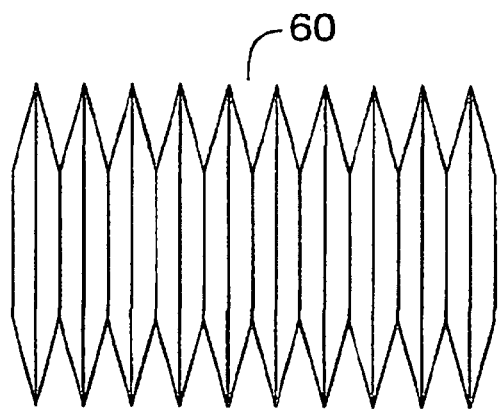
Fig. 4A Fig. 4B
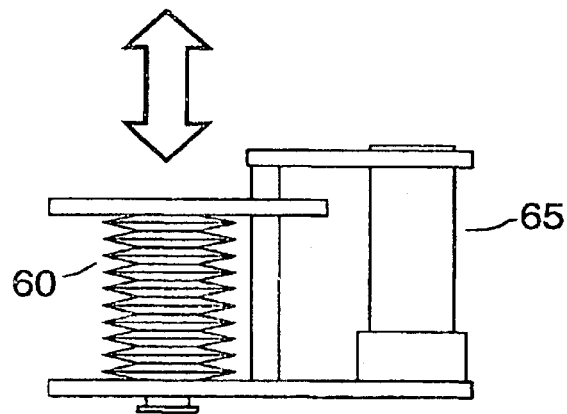
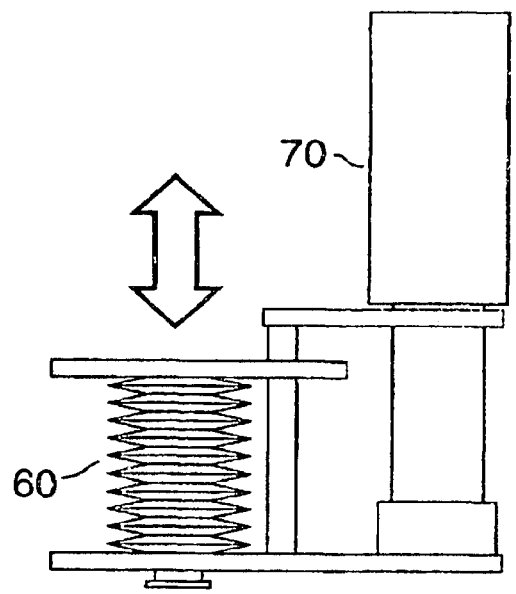
Fig. 4C Fig. 4D

US 6,887,337 B2

APPARATUS FOR ETCHING SEMICONDUCTOR SAMPLES AND A SOURCE FOR PROVIDING A GAS BY SUBLIMATION THERETO

CROSS REFERENCE TO A RELATED APPLICATION

This application claims the benefit of U.S. Provisional Application No. 60/233,512 filed on Sep. 19, 2000.

FIELD OF THE INVENTION

The present invention relates to an apparatus for etching semiconductor samples. More particularly, the present invention relates to an apparatus for etching semiconductor samples having a variable volume expansion chamber and to an apparatus having two or more fixed volume expansion chambers, wherein either apparatus may include an apparatus for detecting the end point of the etching process. The present invention also relates to an improved source for providing a gas by sublimation, in particular a source for providing a gas by sublimation to an apparatus described herein.

BACKGROUND AND DESCRIPTION OF THE PRIOR ART

The etching of silicon by xenon difluoride is well known. Xenon difluoride requires no external energy sources or ion bombardment to etch silicon, and it exhibits high selectivity to many metals, dielectrics, and polymers used in traditional integrated circuit processing, making it easy to integrate with other processes such as CMOS. One of the first references to the use of xenon difluoride in silicon etching is in H. F. Winters and J. W. Coburn, "The Etching of Silicon with $XeF_2$ Vapor," *Appl. Phys. Lett.*, vol. 34, no. 1, pp. 70–73, January 1979, where they demonstrate the high selectivity of xenon difluoride to silicon versus silicon dioxide, silicon carbide, and silicon nitride.

The high selectivity of xenon difluoride to silicon is very useful, particularly in the emerging field known as micro-electro-mechanical systems or MEMS. In MEMS, semiconductor based manufacturing technology and processes are used to produce miniature mechanical devices. One example of a miniature mechanical device produced using MEMS technology is the integrated accelerometer described in S. J. Sherman, W. K. Tsang, T. A. Core, D. E. Quinn, "A Low Cost Monolithic Accelerometer," 1992 Symposium on VLSI Circuits, Digest of Technical Papers, Seattle, Wash., USA, 4–6 Jun. 1992, p. 34–5, which has both a movable mechanical structure and accompanying circuitry to detect the motion of the mechanical structure. The most popular application of this accelerometer is for automotive airbag applications whereby during a crash, the movable mechanical structure moves, and depending on the extent of the motion, the electrical signal produced by the circuitry will determine if the airbag should be deployed. The use of xenon difluoride as an etchant in the production of MEMS devices is well known and is described in, for example, Pister, U.S. Pat. No. 5,726,480.

A number of prior art xenon difluoride etching systems have been described. One example, described in Japanese Patent No. 02187025A, comprises a heated vacuum vessel holding a work piece into which xenon difluoride gas is introduced as the etchant. Another example, shown schematically in FIG. 1, is described in P. B. Chu, J. T. Chen, R. Yeh, G. Lin, J. C. P Huang, B. A. Warneke, and K. S. J. Pister, "Controlled Pulse-Etching with Xenon Difluoride", *Transducers* 1997, Chicago Ill., 16–19 Jun. 1997. This system uses a pulsed etching technique, whereby an intermediate chamber, referred to as an expansion chamber, is used to pre-measure a quantity of xenon difluoride gas and to mix the xenon difluoride with other gases, such as nitrogen, to enhance the etching process. The contents in the expansion chamber are then discharged into a main chamber containing the silicon wafer to perform the etching of the silicon. After the xenon difluoride has been sufficiently reacted, the main chamber, and typically the expansion chamber as well, are evacuated through the use of a roughing or vacuum pump. This process is repeated until the desired degree of etching of the silicon has occurred.

The largest drawback of the pulsed etch system described by Chu et al. relates to the cycling nature of the system. Specifically, since the expansion chamber requires time to fill before the etch begins, is open to the main chamber during the etch, and is typically evacuated during the evacuation step of the cycle, it forms a rate-limiting step in the etching process. This limitation, or bottleneck arises primarily from the time it takes to refill the expansion chamber with xenon difluoride gas after the evacuation step of the previous cycle. The waiting time can often be as long as the time of all of the other steps combined and therefore requires the total process time, or the time the wafer spends in the main chamber, to be approximately double the actual etching time. The term overhead is commonly used to refer to the difference between the total process time and the actual etch time.

Yet another example of a xenon difluoride etching system is described in European Patent No. EP 0 878824 A2. This etching system uses a continuous flow of xenon difluoride gas, which is controlled by means of a flow controller in combination with an expansion chamber, also referred to as a reservoir. Although this process does not require the cycling as in the pulsed etching system of Chu, et al., it does tend to waste xenon difluoride since the xenon difluoride gas is constantly flowing and resides in the main chamber only briefly. The relatively expensive nature of xenon difluoride crystals makes this a major concern. Furthermore, these continuous flow systems are much more sensitive to the geometry of the main chamber and to the placement of the xenon difluoride gas inlet hole(s) in the main chamber which may result in eddies in the flow of xenon difluoride gas.

In the MEMS and semiconductor industries, as in most manufacturing industries, throughput in a manufacturing tool is a major concern. Thus, the system described in Chu, et al. may not be attractive to these industries because it has an inherently high overhead. As described in H. F. Winters and J. W. Coburn, "The etching of silicon with $XeF_2$ vapor," *Appl. Phys. Lett.*, vol. 34, no. 1, pp. 70–73, January 1979, higher etching pressure, that is the pressure of the xenon difluoride gas during the etching process, leads to increased etch rate. Thus, processing time can be decreased and manufacturing throughout can be increased by raising the etching pressure. However, raising the etching pressure in a system such as that described in Chu et al. may not be feasible. FIG. 2 is a graph of the xenon difluoride solid vapor pressure, wherein pressures above the curve at a particular temperature cause the vapor to solidify. As can be seen in FIG. 2, the sublimation pressure of xenon difluoride is approximately 3.8 Torr at room temperature or approximately 20° C. Thus, the pressure in the initial expansion chamber in a system such as that described in Chu et al. is limited to approximately 3.8 Torr if the source of xenon difluoride gas is to be kept at room temperature. Although it is shown in FIG. 2 that heating of the xenon difluoride yields a higher solid vapor equilibrium pressure, heating the xenon difluoride source also accelerates the recrystalization of the xenon difluoride. Ultimately, as the xenon difluoride recrystallizes, its exposed surface area falls, and therefore the sublimation rate of the xenon difluoride from solid to gas falls as well. Since xenon difluoride etching system throughput is based upon etching with xenon difluoride vapor, slower sublimation rates of xenon difluoride vaporhamper the performance of the system.

The ability to accurately determine the etching process end point so as to avoid excess etching is also important. In prior art dry etching processes using xenon difluoride gas, end point detection is typically performed visually. The device being processed is inspected through an optical microscope and etching is stopped when the material being removed is not visible to the eye. Automated end point detection methods using non-optical techniques have not been described for xenon difluoride etching of silicon and related compounds. This is a critical limitation when the process is under full computer control, as found in semiconductor-type cluster tools, and visual inspection is not convenient or possible.

End-point detection systems have been described in the literature for a number of semiconductor manufacturing, etching, and deposition processes, many of which include plasma processing. These have included methods based on optical emission as described in Guinn, et al., U.S. Pat. No. 5,877,032, zero order interferometry as described in Coronel et al., U.S. Pat. No. 5,807,761, RF voltage probing as described in Turner et al., U.S. Pat. No. 5,939,886, acoustic measurements as described in Cadet et al., U.S. Pat. No. 5,877,407, infrared emission measurements as described in Gifford et al., U.S. Pat. No. 5,200,023, atomic spectroscopy as described in Gelernt et al., U.S. Pat. No. 4,415,402, and residual gas analysis as described in Japanese Patent Nos. 11265878, 11204509, and 11145067.

SUMMARY OF THE INVENTION

The present invention relates to an etching apparatus including an etching chamber for holding a sample to be etched, a source of etching gas, and a collapsible, variable volume expansion chamber in selective fluid communication with the source of etching gas and the etching chamber. The etching gas may comprise xenon difluoride with the source of the etching gas being a vacuum tight container holding xenon difluoride crystals. The apparatus may further include a source of mixing gas such as nitrogen in selective fluid communication with the expansion chamber. The apparatus may also further include a vacuum pump in selective fluid communication with the expansion chamber and the etching chamber and a heating and control apparatus for controlling the temperature of the etching chamber and the temperature of the expansion chamber. The variable volume expansion chamber may include a bellows or may include a fixed volume chamber with a movable interior piston. The apparatus may also have a residual gas analysis apparatus coupled to the etching chamber.

In operation, a sample is loaded into the etching chamber and the expansion chamber is set to an initial volume. The etching gas and in some cases the mixing gas are fed into the expansion chamber. The expansion chamber is then placed in fluid communication with the etching chamber and the expansion chamber is collapsed, thereby forcing the gas or gases into the etching chamber. The expansion chamber and the etching chamber are maintained at temperatures at which the etching gas will not solidify at the etch pressure. After the etching is complete, the etching chamber may be evacuated.

The present invention also relates to a method of etching a sample held in an etching chamber at a desired etch pressure. According to the method, a volume of a collapsible, variable volume expansion chamber is set to an initial volume. An etching gas, such as xenon difluoride, is fed into the expansion chamber from a source. The initial volume of the variable volume expansion chamber is determined based on the desired etch pressure, the volume of the etching chamber, and the source pressure. The expansion chamber is then placed in fluid communication with the etching chamber and the expansion chamber is collapsed. During the method, the expansion chamber and the etching chamber are maintained at temperatures at which the etching gas will not solidify at the etch pressure. The feeding step may include feeding a mixing gas, such as nitrogen, into the expansion chamber. The method may further include the steps of taking the expansion chamber out of fluid communication with the etching chamber after the collapsing step, repeating the setting and feeding steps, determining that an etch process taking place in the etching chamber is complete, evacuating the etching chamber after the determining step, and repeating the placing and collapsing steps after the evacuating step. The determining step may include determining that a predetermined etch time has elapsed or analyzing gases drawn from the etching chamber and determining that the etch process is complete when the concentrations of one or more elements or compounds reaches a preset value.

The present invention also relates to an etching apparatus having an etching chamber for holding a sample to be etched, a source of etching gas, such as xenon difluoride, a first expansion chamber in selective fluid communication with the source of etching gas and the etching chamber, and a second expansion chamber in selective fluid communication with the source of etching gas and the etching chamber. The apparatus may further include a source of mixing gas, such as nitrogen, in selective fluid communication with the first and second expansion chambers and a second source of etching gas in selective fluid communication with the expansion chambers. The apparatus may also further include a vacuum pump in selective fluid communication with the expansion chambers and the etching chamber and a heating and control apparatus for controlling the temperature of the etching chambers and the temperature of the expansion chamber. A third expansion chamber in selective fluid communication with the source of etching gas and the etching chamber may also be provided. Each of the expansion chambers may have a fixed volume or may be variable volume expansion chambers. In one embodiment, the apparatus includes three fixed volume expansion chambers of equal size. In another embodiment, the apparatus includes three fixed volume expansion chambers having volumes A, 2A and 4A.

In operation, a sample is loaded into the etching chamber and one or more of the expansion chambers, which may be fixed volume or variable volume, are filled with the etching gas and in some cases the mixing gas. The expansion chamber is then placed in fluid communication with the etching chamber and the variable volume expansion chambers, if any, are collapsed. As a result, the gases are transferred to the etching chamber. The expansion chambers and the etching chamber are maintained at temperatures at which the etching gas will not solidify at the etch pressure. After the etching is complete, the etching chamber may be evacuated.

The present invention also relates to an etching apparatus including a source of etching gas, such as xenon difluoride, an etching chamber in selective fluid communication with the source of etching gas, a flow controller connected between the source of etching gas and the etching chamber and a vacuum pump in selective fluid communication with the etching chamber. A source of mixing gas in selective fluid communication with the etching chamber and a second flow controller connected between the source of mixing gas and the etching chamber may also be provided. The source of etching gas may comprise a vacuum tight container having a mesh mounted in the interior thereof, the mesh being adapted to hold a solid material, such as xenon difluoride crystals, used to generate the etching gas. In operation, this configuration provides for a continuous flow of source and in some cases mixing gas and/or gases to the etching chamber.

The present invention also relates to a source for providing a gas, such as an etching gas for an etching apparatus, by sublimation from a solid material. The source includes a vacuum tight container and a mesh mounted in the interior of the vacuum tight container, wherein the mesh is adapted to hold the solid material. The vacuum tight container may have a cylindrical shape, and the mesh may have a W-shaped or a WW-shaped cross section.

BRIEF DESCRIPTION OF THE DRAWINGS

Further features and advantages of the present invention will be apparent upon consideration of the following detailed description of the present invention, taken in conjunction with the following drawing, in which like reference characters refer to like parts, and in which:

FIGS. 4A through 4D illustrate various embodiments of a variable volume expansion chamber according to an aspect of the present invention;

DETAILED DESCRIPTION OF THE PREFERRED EMBODIMENTS

Figure 3:
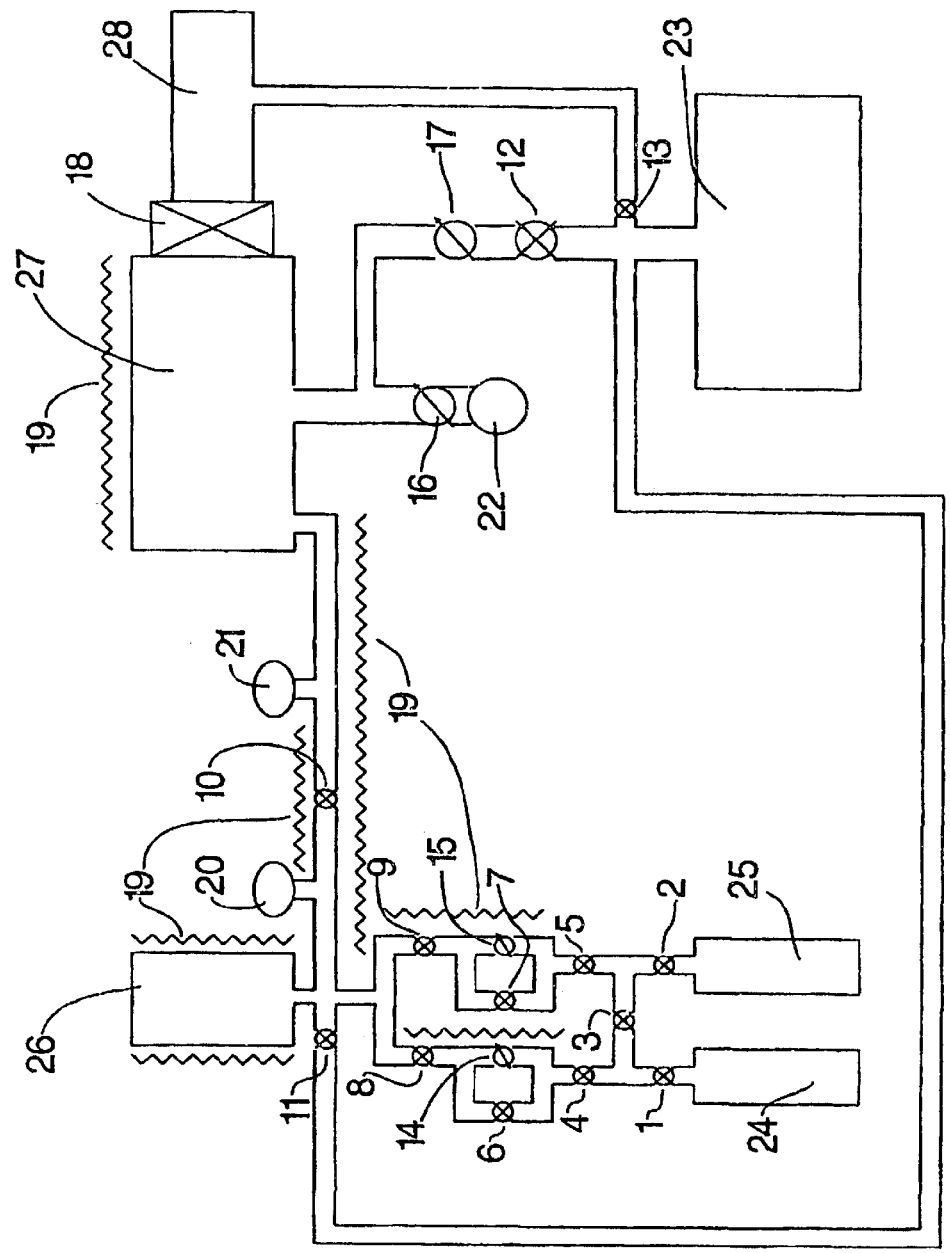
FIG. 3 is a schematic diagram of an etching apparatus according to one embodiment of the present invention.

FIG. 3 shows an etching apparatus according to the present invention. The apparatus includes etching chamber 27 into which the sample to be etched is placed. Etching chamber 27 is preferably made from a material that will not react with the etching gas such as machined aluminum or stainless steel and preferably has a solid transparent lid made from a non-reactive material such as polycarbonate. An optional sample load lock 28 may be provided for loading the sample into the etching chamber 27. Also included are variable volume expansion chamber 26, xenon difluoride source 25, which may comprise a vacuum tight container such as a lecture bottle or micro cylinder such as those available from Whitey Co., a Swagelok Company, of Highland Heights, Ohio, and dry nitrogen source 24, which may comprise a standard gas cylinder of semiconductor grade nitrogen. Numerous other gases could be used in the place of nitrogen including argon and helium. Connected between expansion chamber 26 and nitrogen source 24 and xenon difluoride source 25 is a gas valving manifold comprising pneumatically actuated diaphragm or bellows valves 1 through 9 and needle valves 14 and 15 that selectively adjust the flow of the gases. Pressure measuring devices 20 and 21, preferably capacitance manometers, such as the Type CT27 available from MKS Instruments of Andover, Mass., are provided in the line between variable volume expansion chamber 26 and etching chamber 27. Roughing pump 23, typically a rotary vane pump, with associated valves 11, 12, 13, and 17 and residual gas analysis apparatus 22 with associated vacuum valve 16 are connected as shown.

Figure 2:
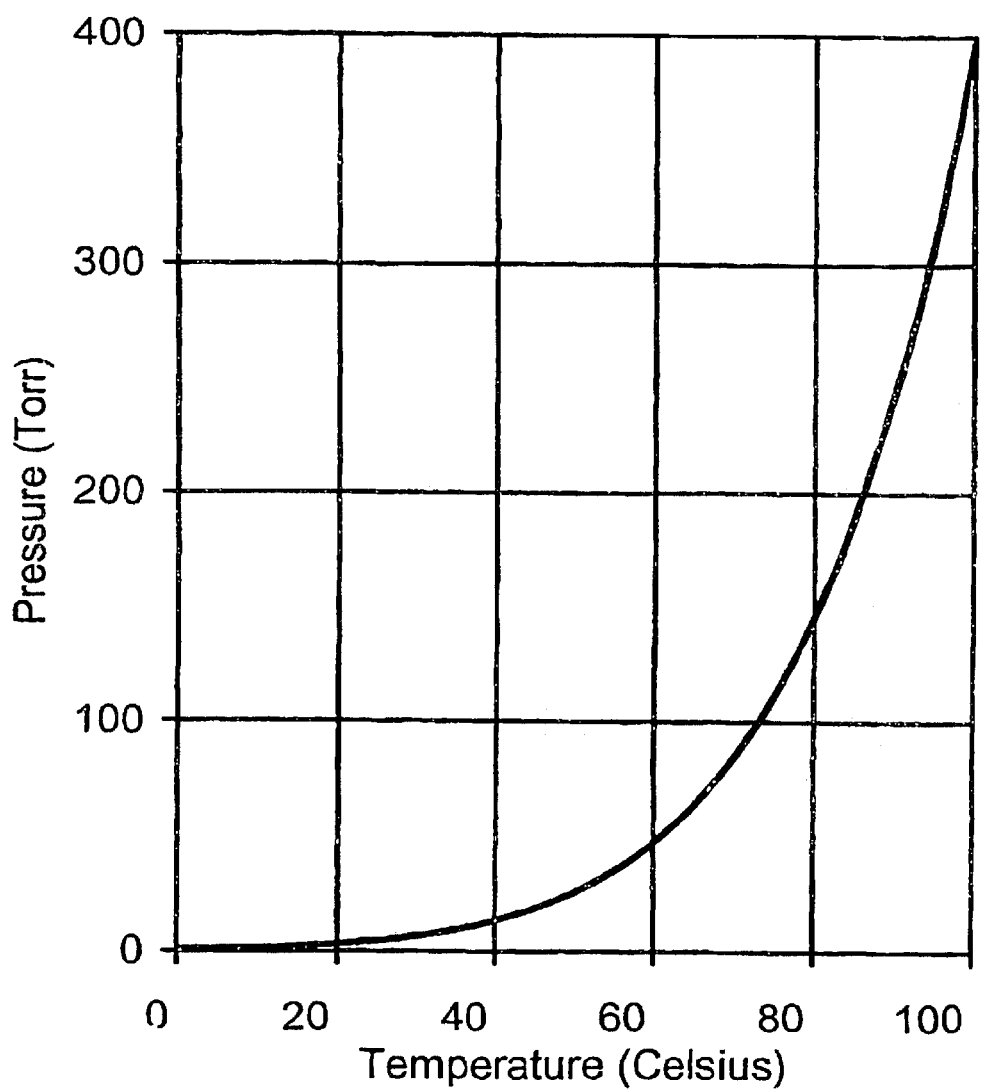
FIG. 2 is a graph showing the solid vapor pressure of xenon difluoride.

The components of the apparatus are interconnected with standard stainless steel tubing or the like, and an automatic heating and control apparatus 19 is provided to regulate the temperature of the apparatus components. A suitable example of automatic heating and control apparatus 19 is the QUAD-3JRG-11XX controller and various thermocouples and heaters available from Watlow Electric Manufacturing Company of St. Louis, Mo. Automatic heating and control apparatus 19 maintains the gas valving manifold, expansion chamber 26 and process chamber 27 at a constant temperature between 21 and 100 degrees Celsius, and preferably at 42 degrees Celsius, a temperature at which, as shown in FIG. 2, the solid vapor pressure of xenon difluoride is 15 Torr. Controlling the temperature of the etchant gas and the surrounding vacuum system prevents the condensation of the xenon difluoride gas onto the walls of the vacuum system and assists in tuning the etching process.

The variable volume expansion chamber 26 is a chamber for holding vapor, the interior volume of which can be selectively adjusted. Variable volume expansion chamber 26 may be made from commercially available stainless steel edge welded bellows such as those shown at reference numeral 60 in FIG. 4A in a compressed state and FIG. 4B in an expanded state. Bellows 60 may be mounted on rigid support mechanism 65 as shown in FIG. 4C to ensure that the bellows 60 are compressed and expanded linearly, resulting in a longer life. As used in the apparatus of the present invention, bellows 60 may be compressed or expanded manually, or alternatively, bellows 60 may be fitted to motor drive 70 as shown in FIG. 4D for automatic compression and expansion. Suitable bellows are available as a single stand-alone component from the Kurt J. Lesker Company, of Clairton, Pa. Alternatively, variable volume expansion chamber 26 may be manufactured using a fixed volume vessel incorporating an interior sliding seal piston arrangement. The piston in such an arrangement may be driven either manually or automatically through use of a motor drive for collapsing variable volume expansion chamber 26.

Xenon difluoride crystals are typically supplied in vacuum tight bottles having an appropriate isolation valve.

Such bottles may be used as source 25 with the isolation valve being valve 2. In operation, xenon difluoride source 25, which could comprise several bottles or containers connected by a manifold (not shown), is connected to the etching apparatus shown in FIG. 3 and a vacuum system purge sequence is initiated. In particular, valves 6, 7, 8, 9, 10, 12 and 17 are opened and roughing pump 23 evacuates all of the interconnected components. The apparatus is then flushed with dry clean nitrogen or other gas from source 24 by opening valves 1 and 4 and subsequently re-evacuated. This procedure is preferably repeated three times, after which, with the apparatus under vacuum, valves 12 and 17 are closed and the user is prompted to open valve 2 connected to the xenon difluoride source 25.

A sample to be etched is loaded into the etching chamber according to the following method. First, load lock chamber 28 is vented and the sample is loaded onto the transfer arm of load lock chamber 28. Load lock chamber 28 is closed and subsequently evacuated by opening valve 13. Thereafter, gate valve 18 between load lock chamber 28 and evacuated etching chamber 27 is opened. The sample is transferred into etching chamber 27 and gate valve 18 to load lock chamber 28 is closed.

The system parameters to be chosen by the user include one or more of: xenon difluoride to nitrogen gas ratio, etch time, etch pressure, and number of cycles. The xenon difluoride to nitrogen gas ratio refers to the ratio of xenon difluoride to nitrogen gas by partial pressure to be introduced into etching chamber 27 and is controlled by selectively opening the valves of the gas valving manifold. The etching gas is preferably fed into the expansion chamber first, before any mixing gas. The etch time is the time the etching gas mixture is allowed to remain in etching chamber 27 before etching chamber 27 is evacuated. The etch time may begin when expansion chamber 26 is placed in fluid communication with etching chamber 27 and may end when such fluid communication is terminated or when etching chamber 27 is evacuated. The etch pressure refers to the pressure inside etching chamber 27 while the sample is being etched, i.e., the pressure when the gas mixture is inside etching chamber 27. The number of cycles refers to the number of times the etch procedure is repeated for the sample in etching chamber 27. The precise values for each of these parameters is dependent on and will thus vary with the nature of the sample to be etched and may be chosen by one of skill in the art.

When the etch process is initiated, the expansion chamber 26 is evacuated using roughing pump 23 by opening valve 11. Valve 11 is then closed and the variable volume expansion chamber 26 is set to the desired initial volume. Choosing the initial fill volume of variable volume expansion chamber 26, for example, by compressing or expanding the bellows or by moving the interior piston, sets the etch pressure because when variable volume expansion chamber 26 is collapsed, for example, manually or under motor control, substantially all of the etching gas mixture will be transferred from variable volume expansion chamber 26 to etching chamber 27. If variable volume expansion chamber 26 is set to an initial volume that is equal to the volume of etching chamber 27, then the etch pressure after variable volume expansion chamber 26 is collapsed will be substantially equal to the pressure in variable volume expansion chamber 26. If the initial volume of expansion chamber 26 is set to some multiple X of the volume of etching chamber 27, then the etch pressure after the expansion chamber is collapsed will be approximately equal to the same multiple X of the pressure in the variable volume expansion chamber 26.

After the initial volume of variable volume expansion chamber 26 is set, valves 4, 5, 8, and 9 are opened in the appropriate sequence and the desired ratio of etching and mixing gasses is allowed to feed or flow into the expansion chamber 26 until an initial pressure set point chosen by the user as measured by pressure measuring device 20 is obtained. Valves 14 and 15 are needle valves preset to a pre-fixed open position. Alternatively, variable volume expansion chamber 26 may be extended during the fill period.

When the initial pressure set point in variable volume expansion chamber 26 is reached, valves 4, 5, 8, and 9 are closed, valve 10 is opened and the variable volume expansion chamber 26 is collapsed by compressing bellows 60 or by driving a piston provided as a part of variable volume expansion chamber 26. As a result, substantially all of the gas contained in variable volume expansion chamber 26 is transferred to etching chamber 27, which reaches its final process pressure as measured by pressure measuring device 21. Valve 10 is then closed and a system timer in automatic heating and control apparatus 19 is started. If the number of cycles to be performed is greater than one, variable volume expansion chamber 26 is extended to its initial position and refilled with process gas from sources 24 and 25. The ability to refill variable volume expansion chamber 26 while the etch process is taking place in etching chamber 27 is advantageous because it increases throughput by allowing a filled variable volume expansion chamber 26 to be ready to go as soon as the etching cycle is complete. This can be contrasted to prior art systems such as that described in Chu et al. which requires the expansion chamber to be open to the etching chamber during the entire etch process thereby preventing it from being refilled until after the etch cycles is complete. Before refilling begins, variable volume expansion chamber 26 may be executed by roughing pump 23 by opening valve 11. Variable volume expansion chamber 26 may optionally be cooled to room temperature before refilling, thereby allowing more gas to enter.

The process of collapsing variable volume expansion chamber 26 that is set to a volume larger than the volume of etching chamber 27 in the present apparatus thus enables xenon difluoride gas to be supplied to etching chamber 27 at high pressure without exposing the xenon difluoride vapor from source 25, which is typically at room temperature, to pressures that would otherwise force it to solidify. This is possible because the automatic heating and control apparatus 19 maintains the vacuum system, particularly the gas valving manifold; variable volume expansion chamber 26; etching chamber 27; and the interconnecting tubing at a high enough temperature according to the parameters of FIG. 2 such that the xenon difluoride vapor does not solidify. According to an aspect of the present invention that contemplates a computer controlled system, when the user sets the desired etch pressure, the control electronics set the etching temperature by setting automatic heating and control apparatus 19 to the appropriate value determined in accordance with the parameters in FIG. 2. It should be noted that it is not necessary that each of the components of the vacuum systems be kept at the same temperature. Rather, it is necessary that each of the components be at a temperature that is at least as high as the temperature at which the xenon difluoride gas will not solidify.

In addition, when variable volume expansion chamber 26 is collapsed, the xenon difluoride gas is forced out of the variable volume expansion chamber 26 and into etching chamber 27. Because the xenon difluoride and nitrogen gases are forced into etching chamber 27, etching can begin sooner and process speed is increased as compared to the prior art described in Chu et al., which utilized a fixed expansion chamber wherein the process gas has to naturally flow from the expansion chamber to the etching chamber. Forcing the gas out of variable volume expansion chamber 26 also allows more of the gas, and in particular the xenon difluoride gas, to be utilized during the etch, which conserves the xenon difluoride crystals.

When the etch time has elapsed, valves 12 and 17 are opened and roughing pump 23 evacuates etching chamber 27. When a sufficiently low pressure, preferably on the order of 50 milliTorr, is achieved, valves 12 and 17 are closed and the process is repeated until the total number of preset etch cycles is completed. Valve 10 may optionally be opened so that variable volume expansion chamber 26 may be evacuated simultaneously with etching chamber 27. In this instance, however, variable volume expansion chamber 26 cannot be refilled until after this evacuation step.

When all of the etch cycles have been completed, variable volume expansion chamber 26 is set to its maximum volume position. Valves 12 and 17 are opened, and roughing pump 23 evacuates the etching chamber 27. Valves 12 and 17 are then closed and etching chamber 27 is filled with dry nitrogen gas from source 24 by opening the appropriate valves in the gas valving manifold. This procedure is preferably repeated three times, which flushes out etching chamber 27, leaving it in a final evacuated state. Valve 10 may also be opened during the excavation steps so that variable volume expansion chamber 26 may be evacuated and flushed along with etching chamber 28.

Next, gate valve 18 between the load lock chamber 28 and etching chamber 27 is opened. The sample is transferred into the load lock chamber 28 and gate valve 18 to load lock chamber 28 is closed. Load lock chamber 28 is vented and the sample is unloaded from the transfer arm.

Additionally, if variable volume expansion chamber 26 is large enough, for example ten times as large as etching chamber 27, and a conductance limiting device, such as a butterfly valve, for example, a Type 153 butterfly valve available from MKS Instruments of Andover, Mass., is installed in the roughing pump line adjacent valve 12, the etching apparatus can be operated in a quasi-continuous mode with a set desired pressure in etching chamber 27 by controlling the rate at which expansion chamber 26 collapses, and thus the rate that gas is transferred to etching chamber 27, and the degree of operation of the roughing pump 23, and thus the rate at which gas is removed from etching chamber 27.

Moreover, if a quick response valve is installed in the roughing pump line, brief pulses from roughing pump 23 during the etching process, i.e., when etching chamber 27 is full of gas, may be used to flush some of the etching by-products from etching chamber 27 and provide agitation to increase the etching effectiveness. Fresh xenon difluoride gas might be also drawn into etching chamber 27 during the brief pumping pulse by opening valves 2, 5, 9 and 10.

Figure 5:
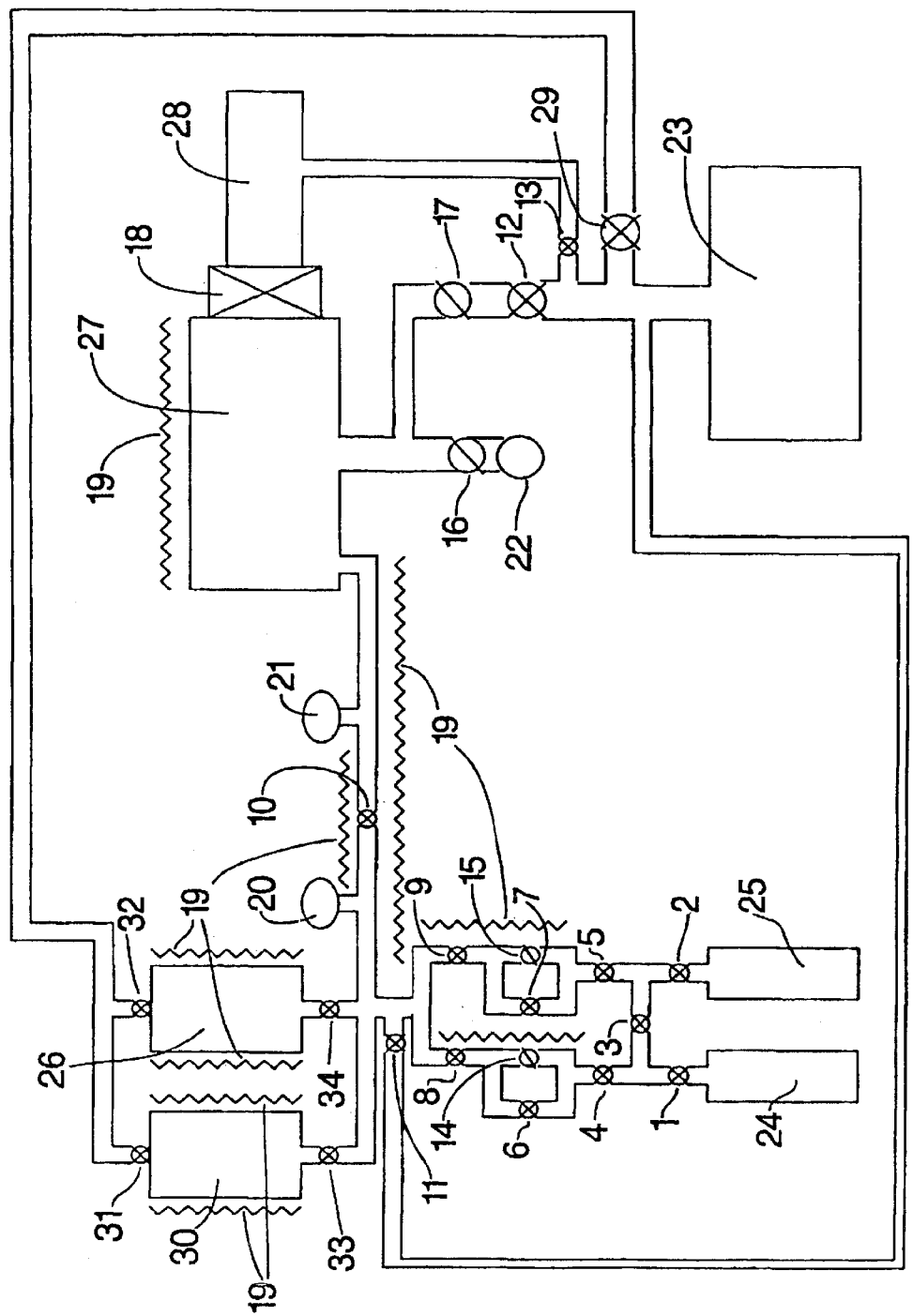
FIG. 5 is a schematic diagram of an etching apparatus according to a second embodiment of the present invention.

A second embodiment of an apparatus according to the present invention is shown in FIG. 5. The apparatus shown in FIG. 5 includes second variable volume expansion chamber 30. Alternatively, variable volume expansion chambers 26 and 30 may be replaced by fixed volume expansion chambers having the same or different fixed volumes. The configuration shown in FIG. 5, whether using fixed or variable volume expansion chambers, allows for increased and variable capacity in terms of the amount of gas that can be transferred to etching chamber 27 during each cycle.

Figure 10:
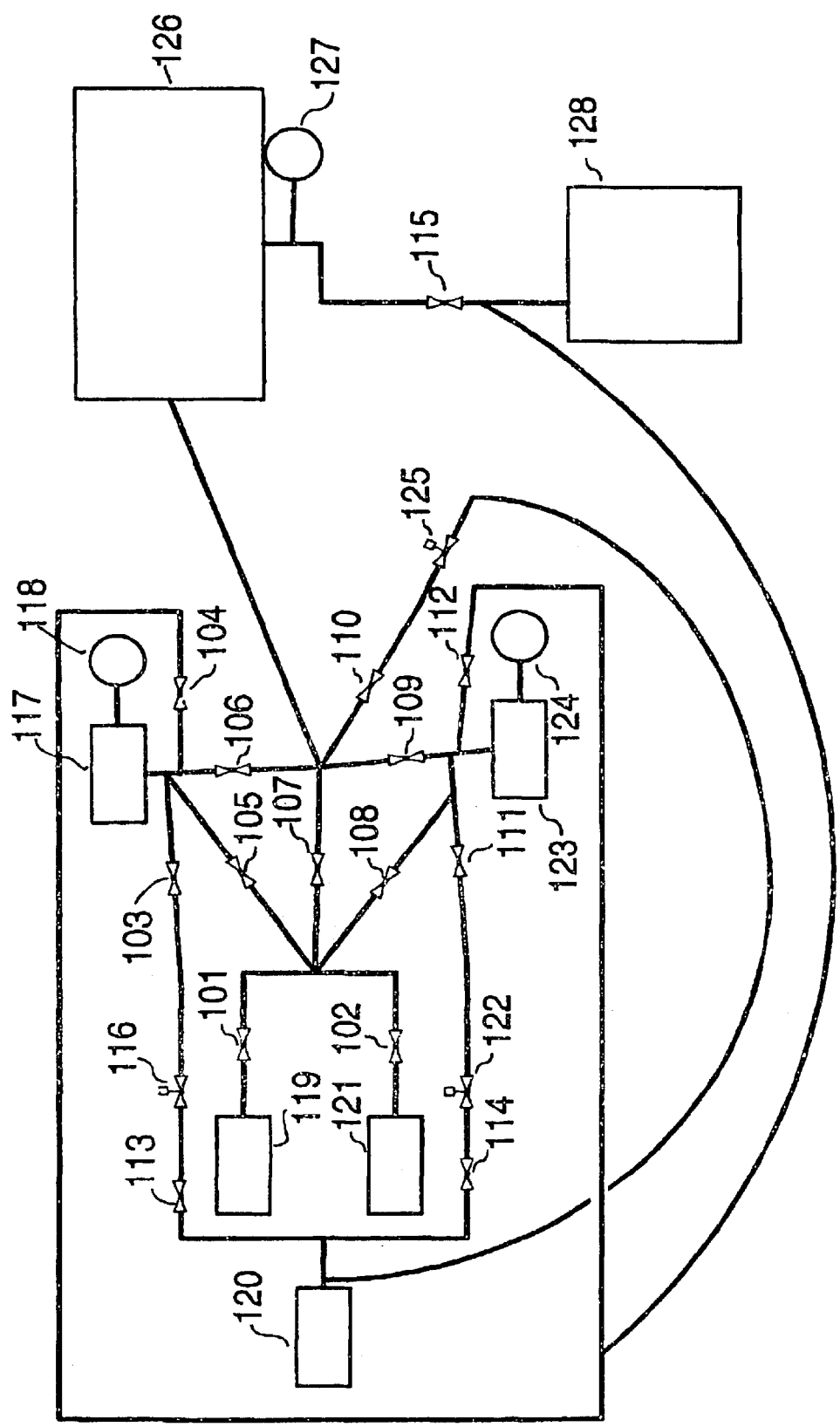
FIG. 10 is a schematic diagram of an etching apparatus according to a sixth embodiment of the present invention.

Furthermore, if the expansion chambers shown in FIG. 5, whether fixed or variable volume, are each provided with separate fluid connections to sources 24 and 25, and if a separate fluid connection from expansion chambers to etching chamber 27 is provided, as is the case with the embodiment shown in FIG. 10, throughput may be increased by allowing one expansion chamber to fill while the other is being used to etch. Furthermore, additional expansion chambers of fixed and/or variable volume in any combination can be added in a similar fashion. Valves 31 and 32 and associated tubing connected to roughing pump 23 may be provided to enable the expansion chambers to be evacuated without going through etching chamber 27.

Figure 6:
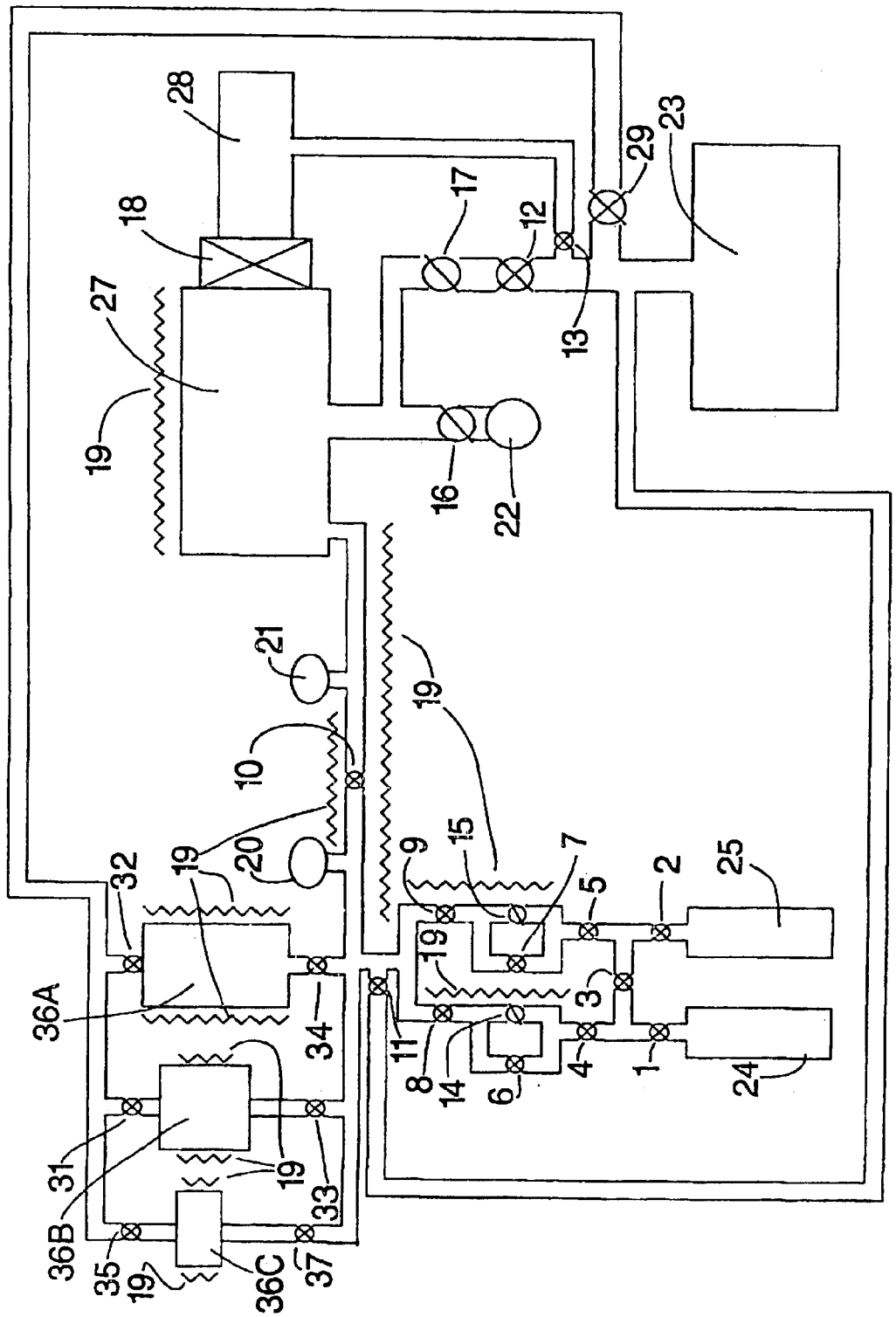
FIG. 6 is a schematic diagram of an etching apparatus according to a third embodiment of the present invention.

Referring to FIG. 6, a third embodiment of the present invention is shown that utilizes multiple fixed volume expansion chambers of different volumes. The embodiment shown in FIG. 6 includes three fixed volume expansion chambers 36A, 35B and 36C connected to the gas valving manifold through valves 33, 34 and 37. In addition, valves 31, 32 and 35 are provided to allow fixed volume expansion chambers 36A, 36B and 36C to be evacuated using roughing pump 23. Although three fixed volume expansion chambers are shown in FIG. 6, it is possible to use two fixed volume expansion chambers or four or more fixed volume expansion chambers. One very flexible combination of fixed volume expansion chambers is to have, for example, three fixed volume expansion chambers such as 36A, 36B and 36C, one of volume A, a second of volume 2 times A, and a third of volume 4 times A. This arrangement allows, through selecting different combinations of fixed volume expansion chambers, a range of total volume from A, 2A, 3A, 4A, 5A, 6A, 7A, 8A, to 9A that can be supplied to the etching chamber 27 for etching by opening the appropriate valves and allowing process gas to flow into etching chamber 27. This flexibility is particularly attractive for process development whereby users of the equipment can quickly identify the best total sized expansion chamber for their application.

Figure 7:
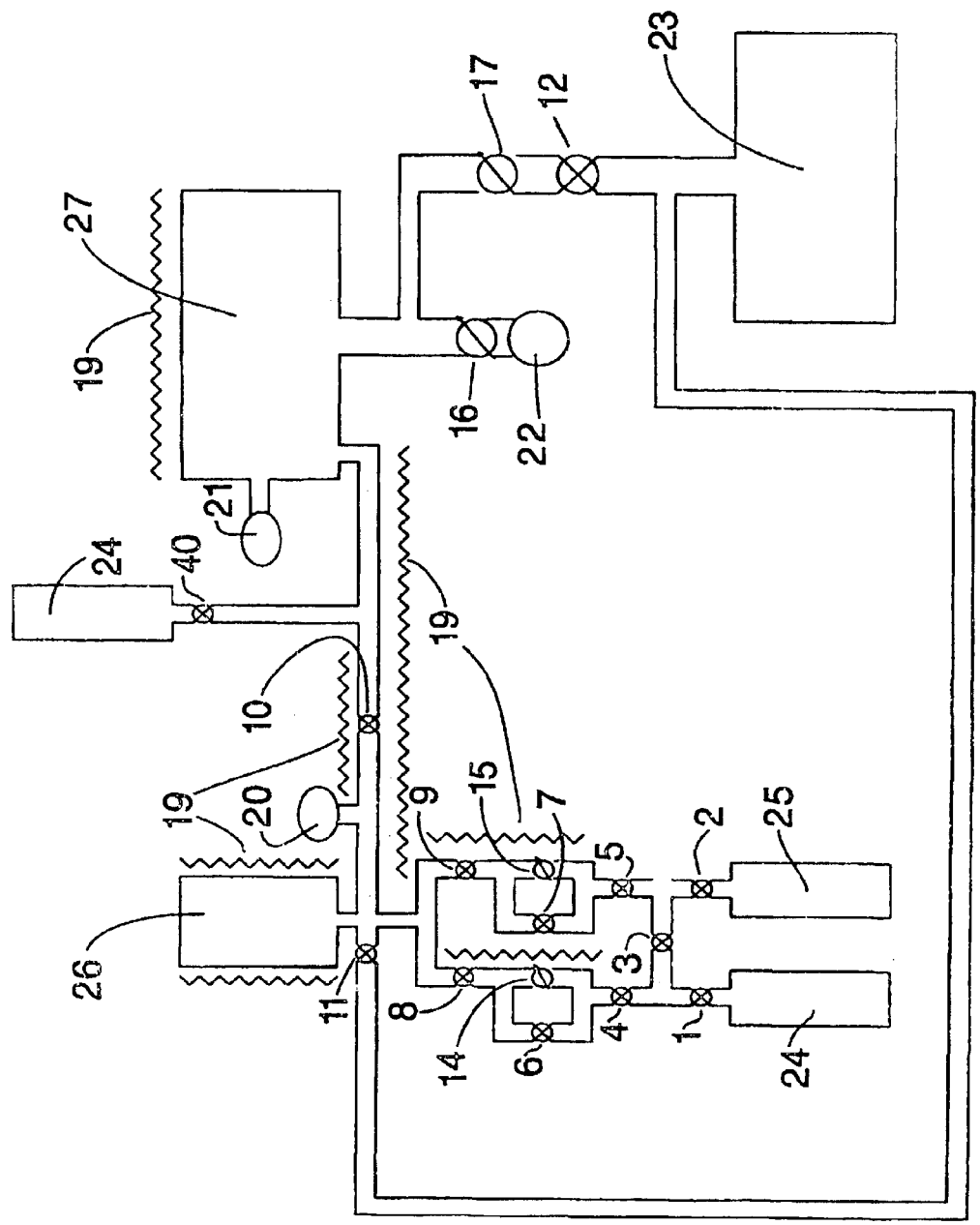
FIG. 7 is a schematic diagram of an etching apparatus according to a fourth embodiment of the present invention.

A fourth embodiment of the apparatus configuration is shown in FIG. 7. The apparatus shown in FIG. 7 is similar to that shown in FIG. 3 except that load lock components 18, 28, and 13 have been removed. In many research applications, the ability to place the wafers directly into the etching chamber 27 is acceptable, and in some cases, preferred over the automated handling which accompanies a load lock system. Also, as shown in FIG. 7, an additional nitrogen source 24 and associated valve 40 are provided and are intended to be used for flushing the apparatus.

Referring to FIGS. 3, 5, 6 and 7, a residual gas analysis, or RGA, apparatus 22 may be used to determine when the etch process is complete. RGA apparatus 22 is connected to etching chamber 27 through variable inlet valve 16. RGA apparatuses are well known and generally comprise a mass spectrometer or quadrupole analyzer, vacuum valves, a real time calibration independent-type gas unit, a control valve, and an RGA control unit. The RGA control unit is equipped with a control processor and related software for high-speed data acquisition and for generating data analysis and process control commands. If the vacuum level in the etching chamber is low enough, the mass spectrometer or quadrupole analyzer can be installed in the etching chamber 27 itself. Gas by-products from the etching process are pumped through the variable inlet valve 16 and analyzed in the RGA apparatus 22. A computer controller displays a plot of signal intensity versus time. A suitable RGA apparatus is the OmniStar system with corrosive preparation from Pfeiffer Vacuum of Asslar, Germany.

The chemical formula that represents the etch process is as follows:

$$2XeF_2 + Si \Rightarrow 2Xe + SiF_4$$

When the xenon difluoride gas is brought into the etching chamber 27 containing a silicon wafer, the etching process can be monitored on the output screen of RGA apparatus 22 by monitoring signals representing the concentrations of the elements and compounds in this formula RGA apparatus 22 can be set to monitor any or all of the $XeF_2$ signal, the Xe signal and the $SiF_4$ signal. When the etching reaction is complete, these signals will reach some near-constant value, assuming there is no pumping occurring. The etching apparatus' control software can be set to trigger a stop to the etch process when either the $XeF_2$, the Xe or the $SiF_4$ signal, or any combination of two or more of these signals, reaches a preset value. For example, in many cases where there is a finite amount of exposed silicon to be etched, the $XeF_2$ signal should decrease with time as the etch process is performed and then level out to a near constant value when no more $XeF_2$ is being used to etch the wafer and the remaining gas is idle in the process chamber. This example assumes a hypothetical "last pulse" where there is some silicon remaining at the beginning of the etch pulse and none or very little at the end.

Figure 8:
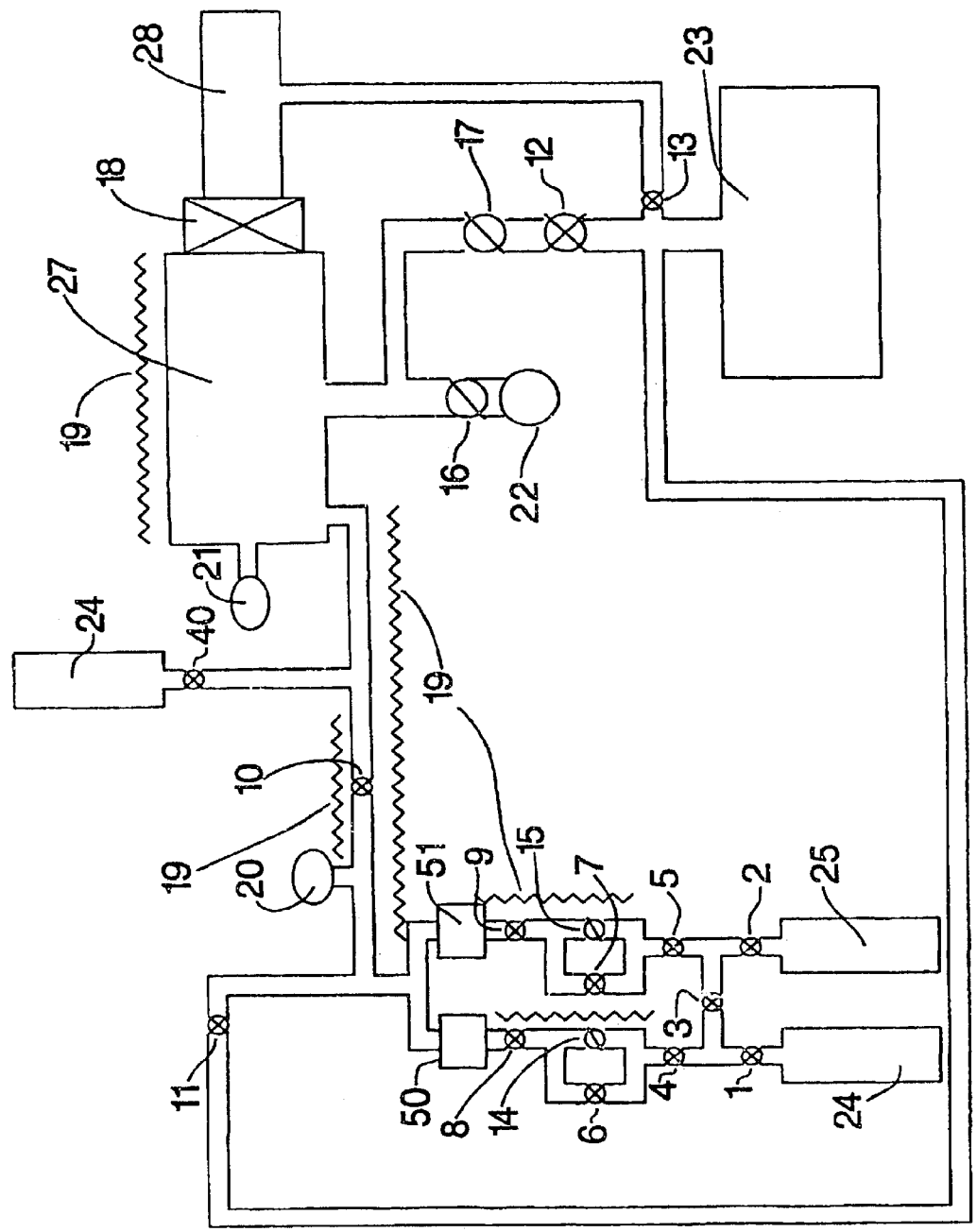
FIG. 8 is a schematic diagram of an etching apparatus according to a fifth embodiment of the present invention.

A fifth embodiment of the apparatus configuration is shown in FIG. 8. This configuration provides a continuous flow etch using xenon difluoride. The apparatus shown in FIG. 8 is similar to that shown in FIG. 3, except that variable volume expansion chamber 26 has been removed along with all of the supporting valves. In addition, flow controllers 50 and 51 have been added. One suitable flow controller is the Type 1179A mass flow controller available from MKS Instruments of Andover, Mass., although other types of well known flow controllers may also be used. Unlike the apparatus described in European Patent Application No. EP 0 878 824 A2, the apparatus shown in FIG. 8 does not employ a reservoir to provide a continuous flow of xenon difluoride. With sufficient exposed surface area of xenon difluoride crystals, the production of xenon difluoride vapor by sublimation is sufficient to etch continuously. Methods of increasing the exposed surface area of xenon difluoride crystals include the use of wide diameter containers, containers having internal trays, and the design shown in FIG. 9B.

Figure 9:
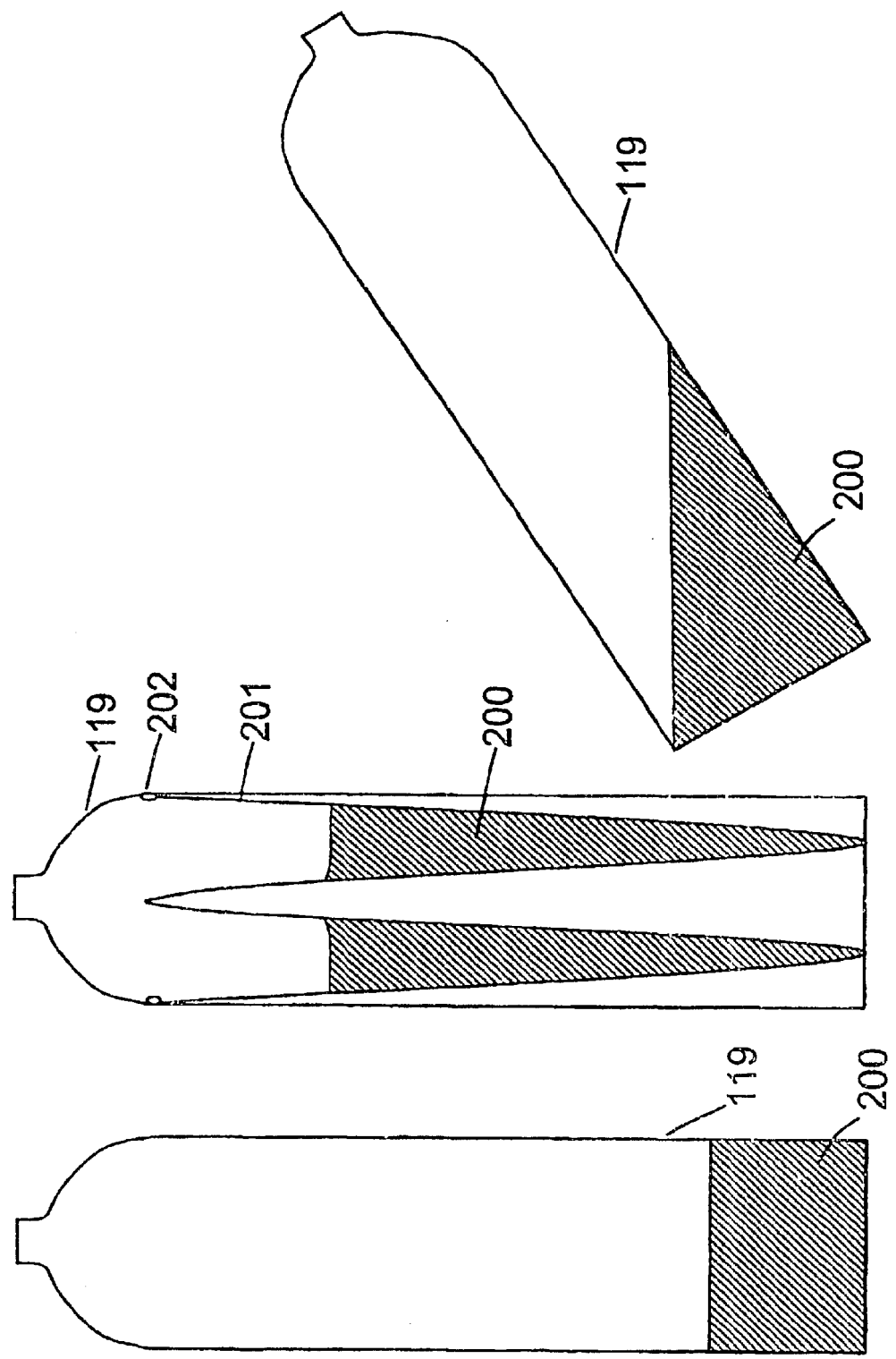
FIGS. 9A and 9C are cross-sectional diagrams of prior art vacuum tight containers for providing a source of gas through sublimation.
FIG. 9B is a cross sectional diagram of a vacuum tight container for providing a source of gas through sublimation according to an aspect of the present invention.

FIG. 9A shows a cross-sectional drawing of a vertically oriented standard gas cylinder 119 containing xenon difluoride crystals 200. FIG. 9B shows the same cylinder 119 with a mesh 201 provided inside adapted to hold the xenon difluoride crystals 200 and to directly expose more of the surface area of xenon difluoride crystals 200. According to one embodiment, the mesh 201 is W-shaped, but more complex shapes can be made as well to further increase the exposed surface area, such as a WW-shaped cross-section. The mesh 201 is inserted into the cylinder before filling it with the xenon difluoride crystals 200. The mesh should be welded, epoxied, taped, or otherwise attached to the wall of cylinder 119 at the edge 202 of the mesh 201. The insertion of the mesh 201 into the cylinder 119 is best done before the neck of the cylinder is created for ease of access into the cylinder. Insertion is, however, still possible to accomplish after the neck has been created due to the restorative nature of the mesh 201 which allows the mesh 201 to naturally re-expand into its full size after being squeezed into the neck of the cylinder 119. Furthermore, the use of the mesh 201 is not limited to standard gas cylinders, but can be used with any number of custom designed vacuum tight containers. The mesh 201 may be made of a number of non-reactive materials including aluminum, stainless steel, and Teflon. The size of the openings in the mesh 201 is selected to be smaller than the majority of the xenon difluoride crystals 200. A typical mesh opening size would therefore be approximately 1 millimeter.

As an example of the increase in the directly exposed surface area that can be obtained using the cylinder design in FIG. 9B is illustrated. A standard lecture bottle or cylinder has an inside diameter of approximately 1.75 inches. When the cylinder is oriented as in FIG. 9A, the directly exposed surface area of the xenon difluoride crystals 200 is approximately 2.4 square inches. A typical lecture bottle allows for a mesh 201 of at least 8 inches tall. Approximating the directly exposed surface area to be comprised of the lateral surface areas of a right circular cone and a portion of a right circular cone, and assuming that the bottoms of the W are at the middle of the radius of the inside of the cylinder and that the xenon difluoride crystals 200 are filled to 7 inches, the exposed surface area in the configuration shown in FIG. 9B is approximately 40 square inches. As a final comparison, if the bottle is tilted as indicated in FIG. 9C, the directly exposed surface area can be increased relative to the configuration shown in FIG. 9B, but to less than approximately 12 square inches, which is still far less than that which can be attained using the mesh 201.

It should be pointed out that the use of attached mesh 201 allows for the use of narrow diameter cylinders or bottles to produce high sublimation rates of xenon difluoride. The compact nature of narrow cylinders or bottles is particularly attractive in minimizing the overall dimensions of the equipment used to etch silicon materials. Additionally, a large exposed surface area can be maintained even when the cylinder or bottle is mounted vertically which further adds to the convenience of mounting in equipment. Also, since the mesh 201 is attached to the cylinder or bottle, the possibility that xenon difluoride crystals might make their way around the top edges of the mesh if the bottle is tipped or jostled is avoided, which makes the cylinders or bottles easy to transport.

A sixth embodiment of the present invention is shown in FIG. 10. The apparatus shown in FIG. 10 comprises etching chamber 126 and two expansion chambers 117 and 123. Etching chamber 126 preferably comprises a machined block of aluminum with a lid preferably made of a solid transparent material such as polycarbonate to allow the observation of the etch process. Expansion chambers 117 and 123 are fixed volume chambers and may comprise aluminum or stainless steel cylinders. The apparatus shown in FIG. 10 preferably includes a heating and control apparatus such as heating and control apparatus 19 shown in FIGS. 3, 5, 6, 7 and 8 to prevent the condensation of the xenon difluoride and nitrogen gasses onto the walls of the tubing and the valve components. The pressure in etching chamber 126 is monitored using pressure sensor 127, which preferably comprises a capacitance manometer, a suitable example of which is the Type CT27 from MKS Instruments of Andover, Mass. Vacuum pump 128, typically a rotary vane vacuum pump, is provided to evacuate one or more of etching chamber 126 and expansion chambers 117 and 123 by selectively opening valves 115, 104 and 112.

The apparatus shown in FIG. 10 includes two gas sources 119 and 121 that comprise gas cylinders such as lecture bottles. Xenon difluoride gas is generated from xenon difluoride crystals through sublimation in the sources 119 and 121. Two sources 119 and 121 of xenon difluoride gas provides increased capacity and added flexibility for the apparatus. For example, one source could be a large bottle and the other source could be a smaller bottle. Also, one of the sources could contain higher quality, higher purity xenon difluoride crystals than the other so that one source could be used for etching that requires greater precision, such as during commercial production, whereas the other could be used for etching that does not require the same level of precision, such as in research and development applications. The components shown in FIG. 10 are interconnected by standard stainless steel tubing or the like.

In operation, after etching chambers 126 and, optionally, expansion chambers 117 and 123 have been evacuated, xenon difluoride gas is allowed to enter the apparatus by opening diaphragm or bellows pneumatically operated valves 101 and 102. The xenon difluoride gas is allowed to enter expansion chambers 117 and 123 by selectively opening the pneumatically actuated valves 105 and 108. The pressure in expansion chambers 117 and 123 is measured using pressure sensors 118 and 124, which are preferably capacitance manometers. A mixing gas from source 120 may be added to the expansion chambers 117 and 123. The mixing gas is typically nitrogen, although other gases such as argon and helium may be used. Also, an additional source 120 having an alternative mixing gas could be provided such that the mixing gas entering expansion chamber 117 is different than the mixing gas entering expansion chamber 123. For expansion chamber 117, the mixing gas flows through pneumatically operated valve 113, through needle valve 116 to provide precise flow control, and through another pneumatically operated valve 103. A similar valve configuration is provided for expansion chamber 123 through pneumatically operated valves 114 and 111 and needle valve 122. Once the pressure in expansion chambers 117 and 123 has reached the set point defined by the user, as measured by pressure sensors 118 and 124, the gas contained in the expansion chambers 117 and 123 is selectively allowed to flow into and enter etching chamber 126 by selectively opening pneumatically operated valves 106 and 109.

Figure 1:
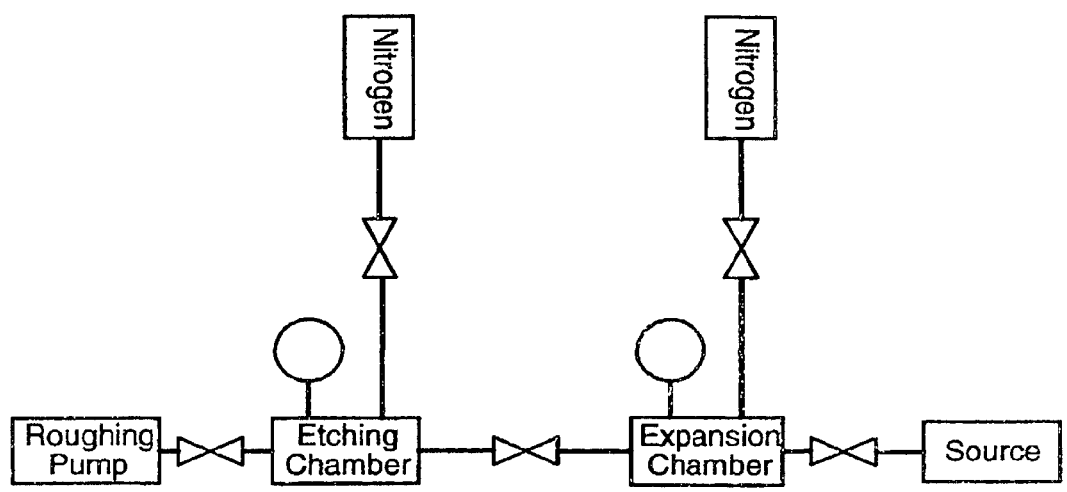
FIG. 1 is a block diagram of a prior art etching apparatus.

Thus, the apparatus shown in FIG. 10 overcomes the rate-limiting or bottleneck problem of the system described in Chu et al. and shown in FIG. 1 because one expansion chamber, for example expansion chamber 117, can be used to etch a sample in etching chamber 126 by opening valve 106, while another expansion chamber, in this example expansion chamber 123, is being filled with gas. After the etch cycle is completed using the expansion chamber 117, etching chamber 126 can be evacuated and the next etching cycle can begin by opening valve 109 and allowing the gas in expansion chamber 123 to enter etching chamber 126. This process can be repeated for as many etching cycles as desired. Down time between etching cycles is therefore eliminated while the second expansion chamber fills with gas. As a further alternative, the apparatus shown in FIG. 10 may be provided with RGA apparatus 22 connected to etching chamber 126 in order to detect etch process completion in the manner described above.

Alternatively, one or both of expansion chambers 117 and 123 may be a variable volume expansion chamber such as those described in connection with FIG. 3, in which case the apparatus shown in FIG. 10 would use heating and control apparatus 19 to maintain the temperature of the apparatus component at a level above the level at which the xenon difluoride gas would solidify.

Pneumatically operated valve 107 allows the xenon difluoride gas to bypass expansion chambers 117 and 123 and diffuse directly from sources 119 and 121 to etching chamber 126. Additionally, etching chamber 126 may be vented/purged with the mixing gas from source 120 between samples by opening pneumatically operated valve 110, in which case the flow of the venting/purging gas is controlled through needle valve 125. Expansion chambers 117 and 123 may also be vented/purged with the mixing gas by additionally opening valves 106 and 109.

Figure 11:
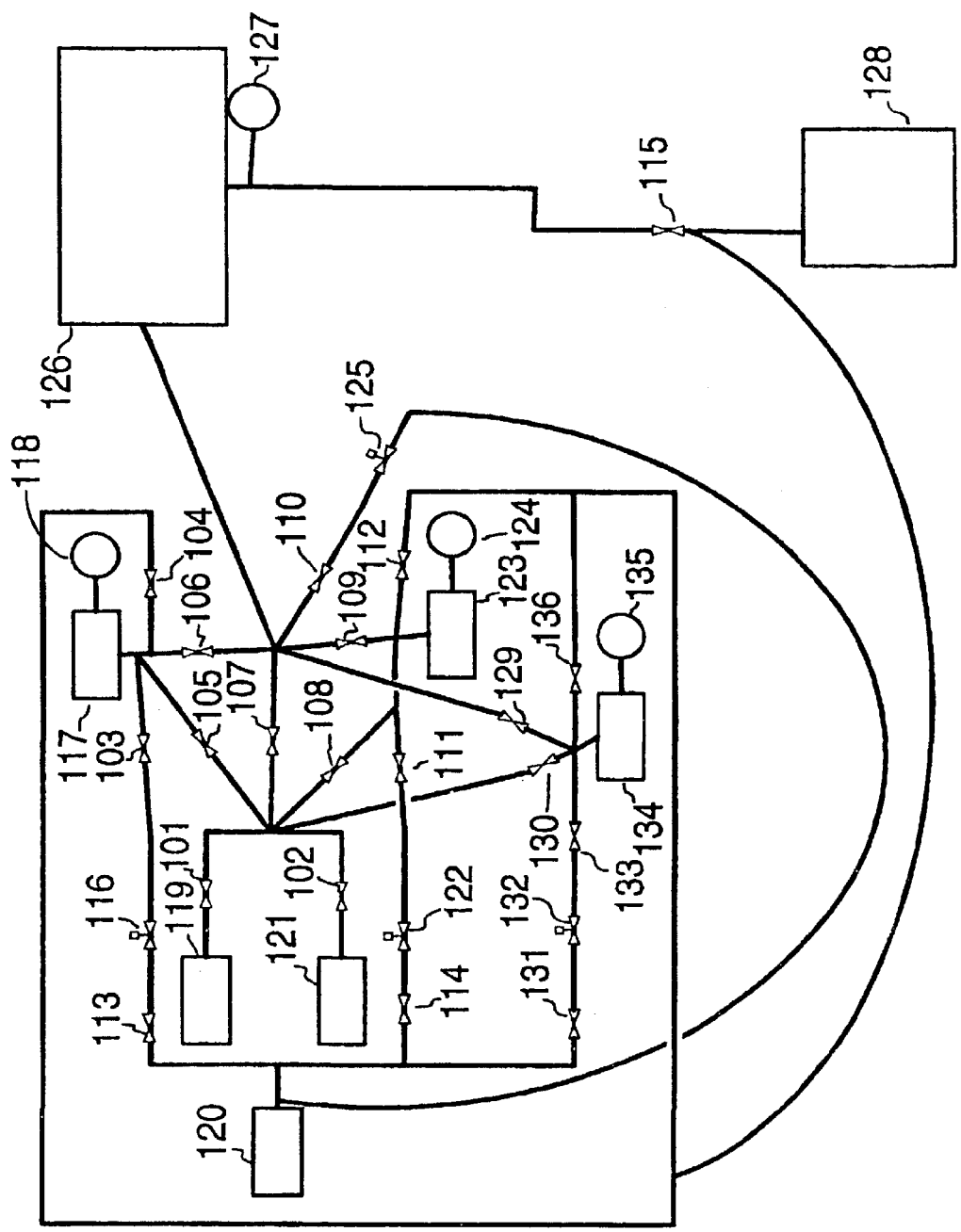
FIG. 11 is a schematic diagram of an etching apparatus according to a seventh embodiment of the present invention.

FIG. 11 shows a seventh embodiment of the present invention similar to the embodiment shown in FIG. 10 but having three expansion chambers 117, 123 and 134 rather than two. The addition of expansion chamber 134 is accomplished by adding valve 131, which is identical to valves 113 and 114, valve 132, which is identical to valves 116 and 122, valve 133, which is identical to valves 103 and 111, valve 130, which is identical to valves 105 and 108, valve 129, which is identical to valves 106 and 109, valve 136, which is identical to valves 104 and 112, and pressure sensor 135, which is identical to pressure sensors 118 and 124. Expansion chambers 117, 123 and 134 may be of the same volume or of different volumes such as those shown and described in connection with FIG. 6.

Figure 12:
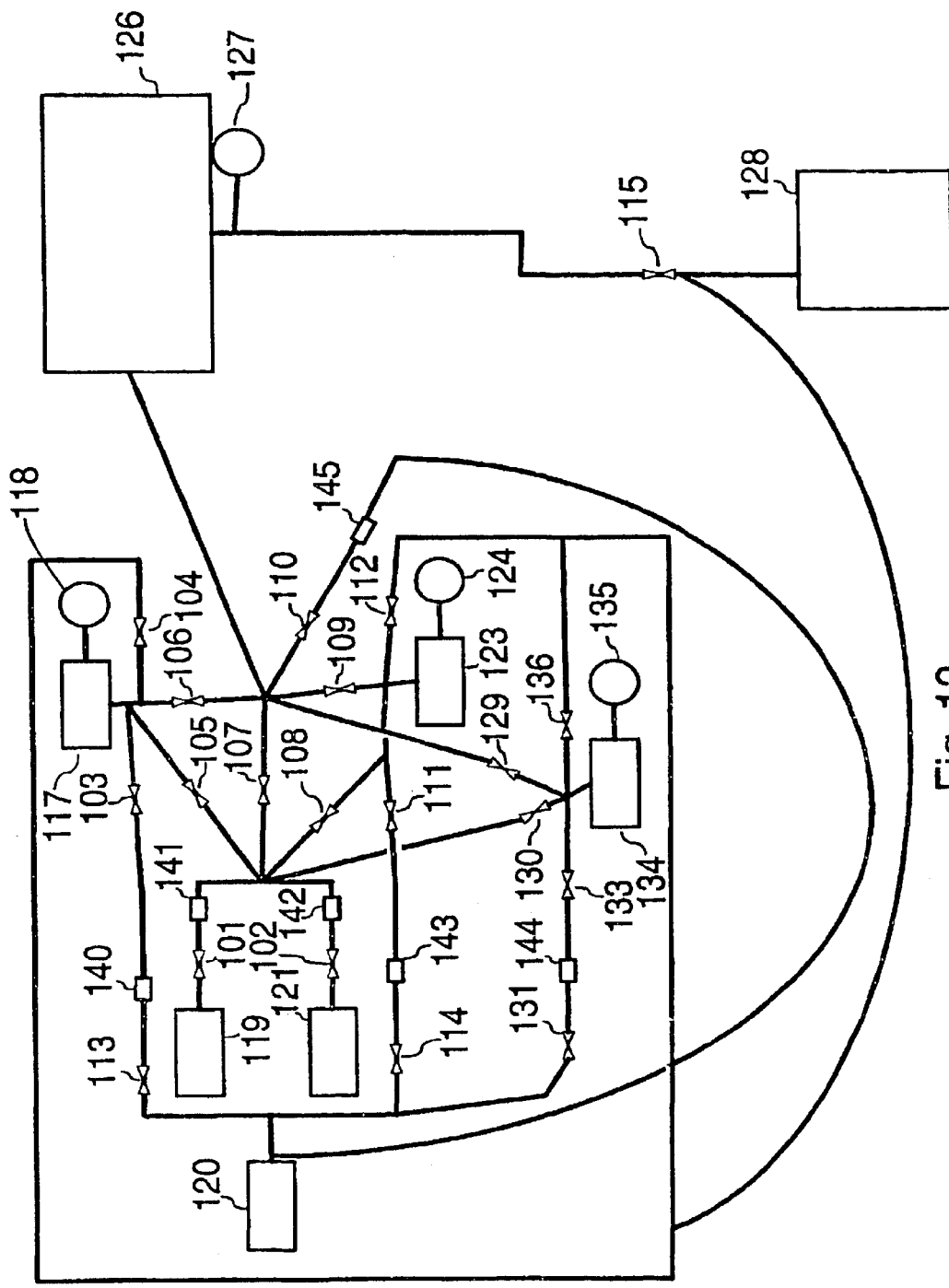
FIG. 12 is a schematic diagram of an etching apparatus according to an eighth embodiment of the present invention.

FIG. 12 shows a variation of the three expansion chamber configuration of FIG. 8 wherein commonly available flow controllers 140, 141, 142, 143, and 144 have been added. An example of a suitable flow controller would be the Type 1179A mass flow controller available from MKS Instruments of Andover, Mass. Flow controllers 140, 141, 142, 143 and 144 allow the flow rate of each gas to be accurately monitored, which is particularly useful when etching continuously rather than using etching cycles. For example, a continuous, accurately controlled etching flow can be produced by opening valve 101, controlling the flow of xenon difluoride gas using flow controller 141, and opening valve 107. If desired, a mixing gas may be added by opening valve 110 and controlling the flow of the mixing gas using flow controller 145. Additional xenon difluoride flow can be provided by opening valve 102 and controlling the flow using flow controller 142. The gases are drawn through the apparatus using the vacuum pump 128 by opening valve 115. Furthermore, at 115, to control the conductance of the vacuum pump 128, and hence adjust the rate that the etching chamber 126 is evacuated by the vacuum pump 128, a butterfly or throttle valve could be added to valve 115 such as the Type 153 available from MKS Instruments of Andover, Mass.

Figure 13:
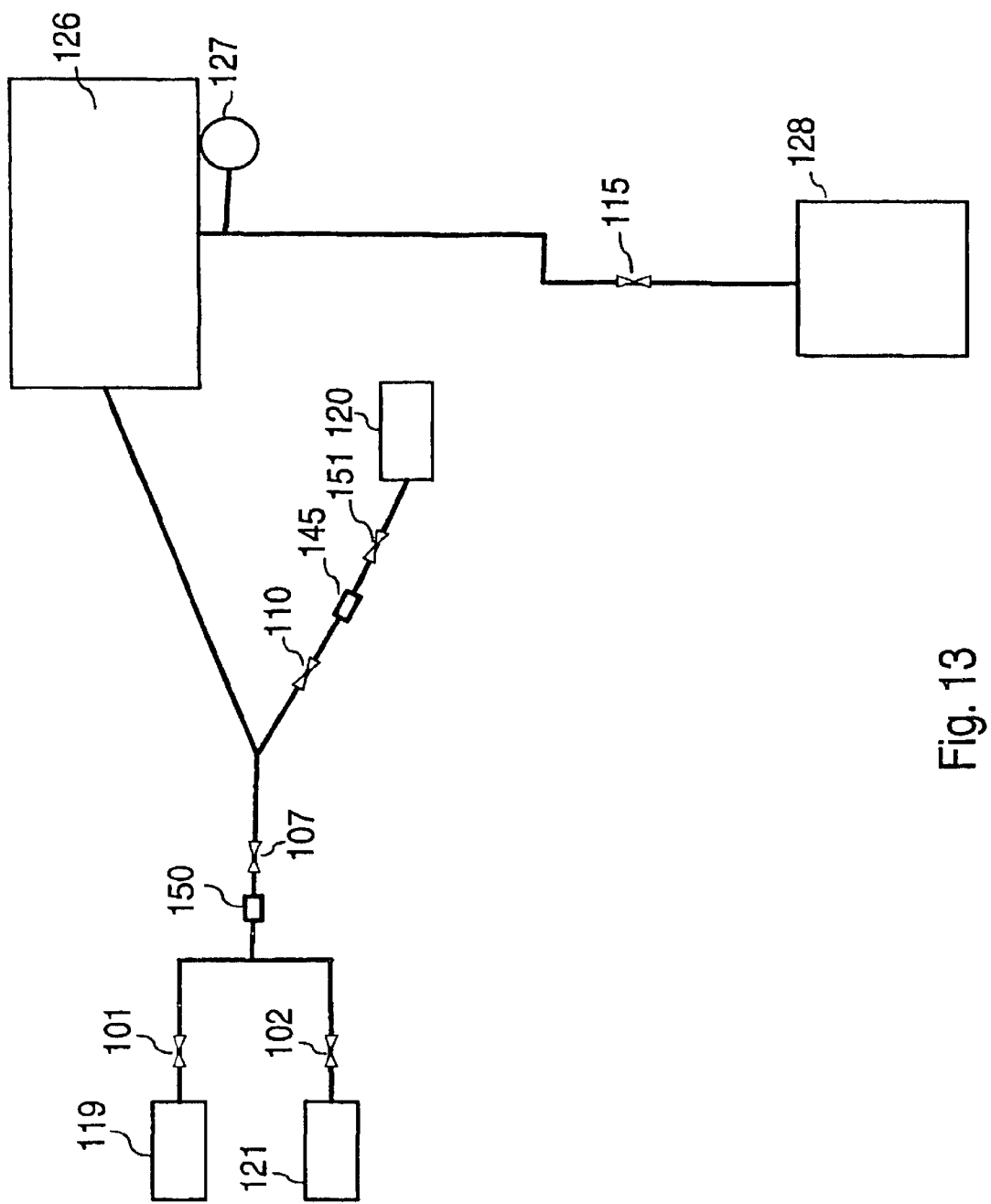
FIG. 13 is a schematic diagram of an etching apparatus according to a ninth embodiment of the present invention.

FIG. 13 shows a simplified controlled flow apparatus, in which the expansion chambers shown in FIG. 12 have been removed along with all of the supporting valves and pressure sensors. The flow controllers 141 and 142 associated with sources 119 and 121 have been replaced with a single flow controller 150. Also shown is an additional valve 151 which provides the ability to isolate the flow controller 145 from source 120. This same valve could be added before flow controller 145 in FIG. 12 as well. Unlike the apparatus described in European Patent Application No. EP 0 878 824 A2, the apparatus in FIG. 13 does not employ a reservoir to provide a continuous flow of xenon difluoride gas. With sufficient exposed surface area of xenon difluoride crystals, the production of xenon difluoride vapor is sufficient to etch continuously. Methods of increasing the exposed surface area of xenon difluoride crystals have been described above in connection with FIGS. 9A, 9B and 9C.

The terms and expression which have been employed herein are used as terms of description and not as limitation, and there is no intention in the use of such terms and expressions of excluding equivalents of the features shown and described or portions thereof, it being recognized that various modifications are possible within the scope of the invention claimed. Although particular embodiments of the present invention have been illustrated in the foregoing detailed description, it is to be further understood that the present invention is not to be limited to just the embodiments disclosed, but that they are capable of numerous rearrangements, modifications and substitutions.

What is claimed is:

1. An etching apparatus, comprising:
   an etching chamber for receiving a sample to be etched;
   a source of etching gas; and
   a collapsible, variable volume expansion chamber, said expansion chamber being in selective fluid communication with said source of etching gas and said etching chamber.

2. An etching apparatus according to claim 1, wherein said etching gas comprises xenon difluoride and said source of etching gas comprises a vacuum tight container holding xenon difluoride crystals.

3. An etching apparatus according to claim 1, further comprising a source of mixing gas in selective fluid communication with said expansion chamber.

4. An etching apparatus according to claim 3, wherein said mixing gas comprises nitrogen.

5. An etching apparatus according to claim 1, further comprising a vacuum pump in selective fluid communication with said expansion chamber and said etching chamber.

6. An etching apparatus according to claim 1, further comprising a beating and control apparatus for controlling a temperature of said etching chamber and a temperature of said expansion chamber.

7. An etching apparatus according to claim 1, wherein said expansion chamber comprises a bellows.

8. An etching apparatus according to claim 7, wherein said bellows comprise stainless steel edge welded bellows.

9. An etching apparatus according to claim 1, wherein said expansion chamber comprises a fixed volume chamber having an interior moveable piston.

10. An etching apparatus according to claim 1, further comprising a sample load lock coupled to said etching chamber.

11. An etching apparatus according to claim 1, wherein a maximum volume of said expansion chamber is greater than a volume of said etching chamber.

12. An etching apparatus according to claim 1, further comprising a residual gas analysis apparatus coupled to said etching chamber.

13. An etching apparatus according to claim 1, further comprising means for analyzing gasses drawn from said etching chamber.

14. An etching apparatus utilizing an etching gas generated from a nongaseous material comprising:
   an etching chamber for receiving a sample to be etched, said etching chamber being in selective fluid communication with a vacuum pumping source;
   a source of said etching gas;
   a first expansion chamber in selective fluid communication with said source of etching gas and said etching chamber, said first expansion chamber having a first fluid connection to a vacuum pumping source, said first fluid connection being independent from said etching chamber and said source of said etching gas; and
   a second expansion chamber in selective fluid communication with said source of etching gas and said etching chamber, said second expansion chamber having a second fluid connection to a vacuum pumping source, said second fluid connection being independent from said etching chamber and said source of said etching gas;
   wherein said first expansion chamber may be selectively evacuated through said etching chamber or through said first fluid connection exclusive of and independently from said source of said etching gas, and wherein said second expansion chamber may be selectively evacuated through said etching chamber or through said second fluid connection exclusive of and independently from said source of said etching gas.

15. An etching apparatus according to claim 14, wherein said etching gas comprises xenon difluoride and said source of etching gas comprises a vacuum tight container holding xenon difluoride crystals.

16. An etching apparatus according to claim 14, further comprising a source of mixing gas in selective fluid communication with said first expansion chamber and said second expansion chamber.

17. An etching apparatus according to claim 16, wherein said mixing gas comprises nitrogen.

18. An etching apparatus according to claim 16, wherein one of said first and second expansion chambers comprise a variable volume expansion chamber.

19. An etching apparatus according to claim 16, wherein said first and second expansion chambers each comprise a variable volume expansion chamber.

20. An etching apparatus according to claim 16, wherein said source of said etching gas is in selective fluid communication with said etching chamber.

21. An etching apparatus according to claim 20, further comprising a flow controller connected between said source of said etching gas and said etching chamber and a vacuum pump in selective fluid communication with said etching chamber.

22. An etching apparatus according to claim 21, further comprising a source of mixing gas in selective fluid communication with said etching chamber and a second flow controller connected between said source of mixing gas and said etching chamber.

23. An etching apparatus according to claim 21, further comprising means for controlling the conductance of said vacuum pump.

24. An etching apparatus according to claim 20, wherein said source of etching gas comprises first and second vacuum tight containers holding said etching gas, said first vacuum tight container and said second vacuum tight container each in selective fluid communication with said second etching chamber, said apparatus further comprising a first flow controller connected between said first vacuum tight container and said etching chamber, a second flow controller connected between said second vacuum tight container and said etching chamber, and a vacuum pump in selective fluid communication with said etching chamber.

25. An etching apparatus according to claim 24, further comprising a source of mixing gas in selective fluid communication with said etching chamber and a third flow controller connected between source of mixing gas and said etching chamber.

26. An etching apparatus according to claim 24, further comprising means for controlling the conductance of said vacuum pump.

27. An etching apparatus according to claim 14, further comprising a second source of said etching, gas in selective fluid communication with said first expansion chamber and said second expansion chamber.

28. An etching apparatus according to claim 14, further comprising an automatic heating and control apparatus for controlling a temperature of said etching chamber, a temperature of said first expansion chamber, and a temperature of said second expansion chamber.

29. An etching apparatus according to claim 14, further comprising a sample load lock coupled to said etching chamber.

30. An etching apparatus according to claim 14, further comprising a residual gas analysis apparatus coupled to said etching chamber.

31. An etching apparatus according to claim 14, further comprising means for analyzing gasses drawn from said etching chamber.

32. An etching apparatus according to claim 14, wherein said first and second expansion chambers have a fixed volume.

33. An etching apparatus according to claim 14, further comprising a third expansion chamber in selective fluid communication with said source of etching gas and said etching chamber.

34. An etching apparatus according to claim 33, said first expansion chamber having a fixed volume equal to A, said second expansion chamber having a fixed volume equal to 2A, and said third expansion chamber having a fixed volume equal to 4A.

35. An etching apparatus according to claim 33, said first expansion chamber having a first fixed volume, said second expansion chamber having a second fixed volume, and said third expansion chamber having a third axed volume, said first, second and third fixed volumes being equal to one another.

\* \* \* \* \*

UNITED STATES PATENT AND TRADEMARK OFFICE
CERTIFICATE OF CORRECTION

PATENT NO. : 6,887,337 B2 Page 1 of 1
APPLICATION NO. : 09/839763
DATED : May 3, 2005
INVENTOR(S) : Lebouitz et al.

It is certified that error appears in the above-identified patent and that said Letters Patent is hereby corrected as shown below:

Column 11, line 9, after "formula" insert -- . --

Column 15, line 27, delete "beating" and insert -- heating --.

Column 16, line 60, after "etching" delete " , "

Column 18, line 10, delete "axed" and insert -- fixed --.

Signed and Sealed this

Third Day of April, 2007

JON W. DUDAS
*Director of the United States Patent and Trademark Office*